United States Patent [19]
Hrkut et al.

[11] Patent Number: 6,136,160
[45] Date of Patent: Oct. 24, 2000

[54] PROCESS FOR PRODUCING A CARBON FILM ON A SUBSTRATE

[75] Inventors: Pavol Hrkut; Peter Hudek, both of Bratislava, Slovakia; Ivaylo W. Rangelow, Kassel, Germany; Hans Löschner, Vienna, Austria

[73] Assignees: IMS Ionen-Mikrofabrikations Systeme GmbH, Vienna, Austria; Universität Gesamthochschule Kassel, Kassel, Germany; Ústav Pocitacových systémov, Slovenská adadémia vled, Bratislava, Slovakia

[21] Appl. No.: 09/349,936

[22] Filed: Jul. 8, 1999

[30] Foreign Application Priority Data

Jul. 9, 1998 [AT] Austria .................................. 1190/98

[51] Int. Cl.$^7$ .................................................. C23C 14/00
[52] U.S. Cl. ............................ 204/192.16; 204/192.12; 204/298.09; 204/192.15; 204/298.07; 204/298.08; 204/192.2
[58] Field of Search ......................... 204/192.16, 192.15, 204/192.2, 298.07, 298.08, 298.09, 192.12

[56] References Cited

U.S. PATENT DOCUMENTS

| | | | |
|---|---|---|---|
| 5,232,570 | 8/1993 | Haines et al. ..................... | 204/192.16 |
| 5,252,367 | 10/1993 | Sato et al. ........................ | 427/130 |
| 5,507,930 | 4/1996 | Yamashita et al. ............... | 204/192.15 |
| 5,618,389 | 4/1997 | Kreider ............................. | 204/192.15 |
| 5,846,613 | 12/1998 | Neuville ........................... | 204/192.16 |

OTHER PUBLICATIONS

Y.A. Li et al., Journal of Materials Science Letters, vol. 17 (1998), pp. 31–35.

E. Broitman et al., Applied Physics Letters, vol. 72, No. 20 (1998), p. 2532–33.

Applied Physics A, vol. 67, No. 1 (Jul. 1998), pp. 11–22 and 39–46.

L. Kouwenhoven, Science, vol. 275 (1997), p. 1896–97.

*Primary Examiner*—Nam Nguyen
*Assistant Examiner*—Daborah Chacko-Davis
*Attorney, Agent, or Firm*—Finnegan, Henderson, Farabow, Garrett & Dunner

[57] ABSTRACT

In order to process a carbon film carbon is deposited on a substrate by sputtering from a carbon sputter target in a gas mixture which contains nitrogen in a minimum proportion of 20% and a sputter gas at a predetermined gas pressure and the substrate is then subjected under a high vacuum to thermal treatment at a temperature above 100° C. The carbon films produced in this manner comprise a fiber and/or tube structure which extends substantially perpendicular to the film.

14 Claims, 3 Drawing Sheets

PROCESS FOR PRODUCING A CARBON FILM ON A SUBSTRATE

BACKGROUND OF THE INVENTION

The invention relates to a process for producing a carbon film on a substrate.

Carbon films are used in many technical areas for the most varied of tasks, for example, as a coating to provide protection against high energy radiation, as a conductive coating or for the purpose of achieving a high emission capability for radiant cooling. The "sputter" technique (cathode sputtering) is a frequently used method for producing carbon films, whereby in a vacuum-gas discharge particles of cathode materials which are released from the cathode surface by impacting ions of the gas discharge deposit themselves on an adjacent substrate where they form a layer, the nature of which is determined by virtue of the conditions with respect to the gas composition, the gas pressure, etc. It is known for the purpose of depositing carbon by means of the sputter technique to use a gas atmosphere with argon or another inert gas. Sputtering of carbon and carbon-nitrogen layers using a high frequency sputter technique is described for example by Y.-A. Li et al., Journal of Materials Science Letters, Vol. 17(1998), Pages 31–38.

A known problem when sputter-depositing carbon, for example, in an argon atmosphere, is that they layers produced in this manner experience an extremely high level of compressive strain, the value of which can be in excess of 100 MPa up to in the region of some GPa, as described, for example, by E. Broitman et al., Applied Physics Letters, Vol. 72, No. 20 (1998), Page 2532. In most cases, the compressive strains lead to the formation of folds and waves on the surfaces on which the carbon layers have been deposited and this renders the layer unusable as well as impairing the adherence to the substrate and/or can adversely affect or even destroy the substrate surface or the entire substrate itself.

A further disadvantage of known carbon layers produced by sputtering is the lack of resistance of the layers to moisture and other contaminants when stored in air.

SUMMARY OF THE INVENTION

It is an object of the invention to provide carbon layers which have a low internal compressive strain or an internal tensile stress and which are stable when stored. It is a further object to demonstrate a process of producing these carbon layers, whereby the internal strain of the layers produced can be adjusted to a predetermined value by means of the process parameters.

The object is achieved by a process for producing a carbon film on a substrate, whereby carbon is deposited on the substrate by sputtering from a carbon sputter target in a gas mixture which contains nitrogen in a minimum proportion of 20% and a sputter gas, e.g. argon, at a predetermined gas pressure and subsequently the substrate is thermal treated at a temperature above 100° C. under a high vacuum.

The object stated is achieved with low expenditure by virtue of this solution. The carbon layers produced in accordance with the invention are characterised not only by low compressive strains of less than 10 MPa or by tensile stresses of a few MPa but also by a high degree of stability with respect to air moisture when stored and by the level of homogeneity of the layers which can be achieved on the substrate.

In a preferred embodiment of the invention, possibly to deposit carbon layers with a particularly low internal strain, the temperature of the substrate is kept favourably at below 50° C. during the sputtering process.

Furthermore, in order to achieve low internal strains in the layer produced, it is expedient if the gas mixture contains nitrogen of a proportion in the range of from 20% to 70%.

In order to achieve strains below approx. 10 MPa, it is advantageous if the gas mixture contains nitrogen in a proportion in the range of from 45% to 55%.

In order to exclude adverse effects from foreign gases, it is favourable if the sputter gas used in the gas mixture is an inert gas, e.g. argon.

In order to obtain a reliable gas discharge, it is expedient if the gas pressure of the gas mixture is between 0.2 Pa to 5 Pa.

The sputtering process is performed in a favourable manner by means of high frequency sputtering, e.g. at 13.56 MHz.

The sputtering process and the thermal treatment are advantageously performed whilst maintaining the vacuum in the same process device. This provides the layers produced with a reliable stability with respect to air moisture.

In order to guarantee that the desired internal strains are produced, the temperature of the substrate is kept favourably below 300° C. during the thermal treatment.

It is a further advantage if during the thermal treatment the substrate is heated within a period of time of at least 30 minutes to a predetermined final temperature of at least 100° C., e.g. to 180° C. and then the substrate is cooled within a period of time of at least 30 minutes to a temperature of 70° C. This produces the best results in the layers.

It is favourable, for instance to avoid contamination, if after thermal treatment the substrate is held under a high vacuum until it has cooled down to a maximum temperature of 70° C.

The object described above is likewise achieved by a substrate which has at least one carbon film which comprises a fibre- and/or tube structure which extends substantially perpendicular to the film. The extremely thin fibres or tubes provide these layers with an abundance of possible applications.

In a particularly favourable embodiment the fibres or tubes of the carbon film have a diameter in the range of from 1 to 30 nm.

The invention is explained in detail hereinunder with reference to a non-limiting exemplified embodiment and the attached drawings, in which:

DETAILED DESCRIPTION

Figure 1:
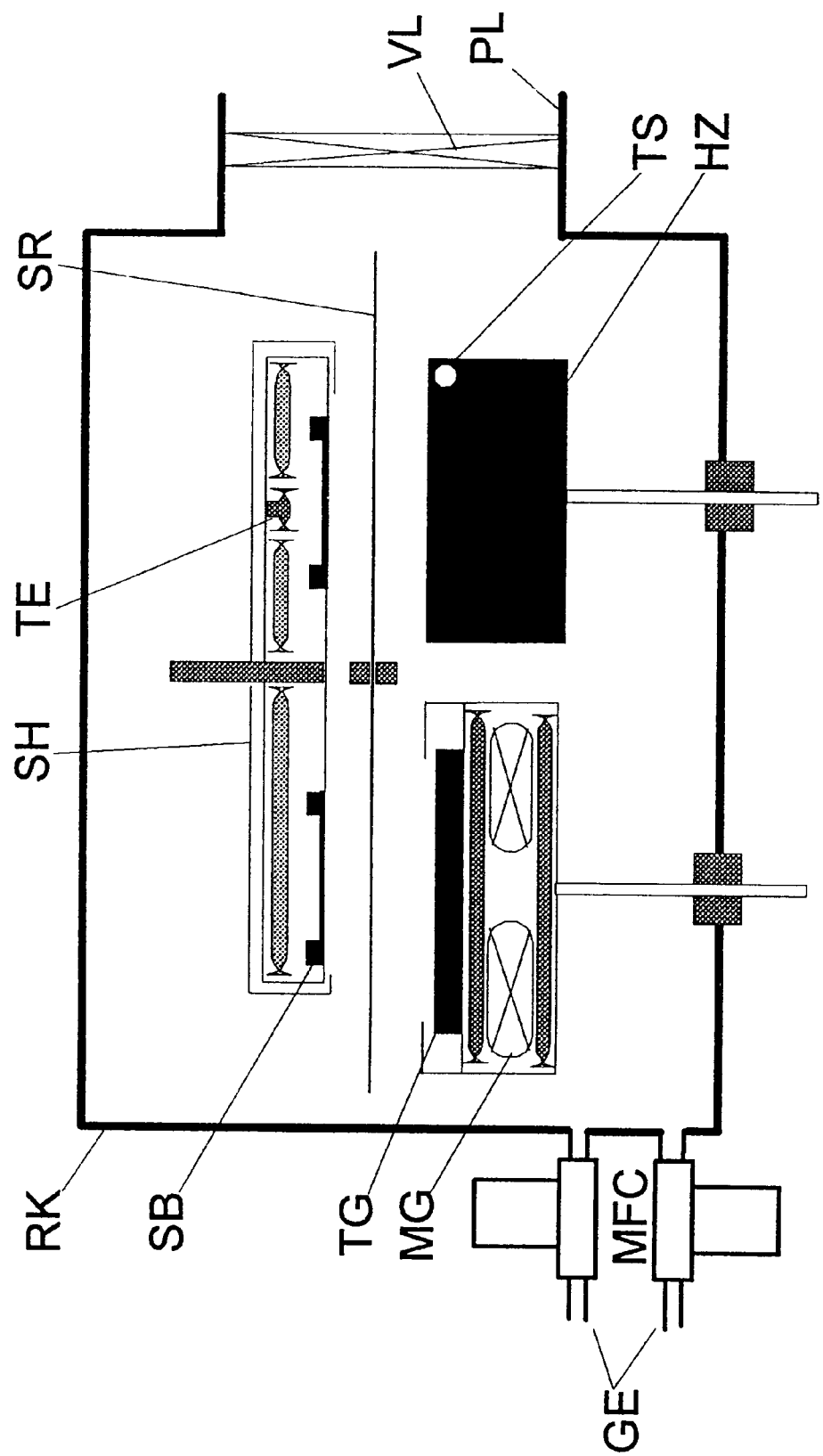
FIG. 1 shows a device for performing the process in accordance with the invention.

A device suitable in accordance with the invention to produce carbon layers is, for example, a process device of the type Alcatel SCM 600. FIG. 1 shows a schematic cross-sectional view through the process chamber RK. In this device the substrate SB to be coated is attached at four holding positions to a wheel which serves as a substrate holder SH. The holding positions each correspond to a process station with a device located below the substrate holder SH to perform a process step; in this case this is a sputtering device having a sputter target TG and a heating element HZ. The substrate holder SH can also be adjusted in its vertical position, so that the distance of the substrate SB to the sputter target TG or the heating element HZ can be adjusted. In addition, a slide SR is introduced into the chamber and shields the substrate SB as required from the sputtering device and/or the heating element. The chamber can be evacuated to create a high vacuum by means of a vacuum pump connected by a pump line PL. A cryogenic pump was used in order to guarantee an oil-free vacuum as far as down to the final pressure achievable in the process chamber RK of approx. $10^{-3}$ PA. One or several gases can be fed into the chamber RK via the gas inlets GE, whereby with the aid of flow regulators MFC, with which the gas flows can be individually adjusted, and of a value VL in the evacuation pump line it is possible to control gas flow, gas composition and gas pressure in an exemplified embodiment to a degree of accuracy of 5% in the chamber RK. Higher degrees of accuracy which will certainly be achievable in the future will lead to a correspondingly precise adjustment of the carbon material parameters.

The process in accordance with the invention comprises two process steps, namely the deposition of the carbon film on the substrate by means of sputtering and the subsequent thermal treatment of the film on the substrate. Both process steps are performed in an advantageous manner in the chamber RK described above, whereby the substrate SB remains on the substrate holder SH and is pivoted from the sputter position into the position for the thermal treatment.

During the sputter process carbon is deposited on the substrate by sputtering from a carbon sputter target in a gas mixture at a predetermined gas pressure. A gas mixture consisting of a sputter gas, for example, argon, and nitrogen is used in a ratio which is adjusted prior to the deposition procedure and fixed during the process. The sputter gas used was in particular argon, but another inert gas can, for example, also be used. The gas pressure is likewise set at the commencement of the sputter process and then maintained substantially constant. The pressure range suitable for producing carbon layers in accordance with the invention ranges during the sputter process from 0.2 Pa to 5 Pa. At 2 Pa pressure, the values of the deposition rate of the carbon film were found around 55 nm/min. Where the pressures are too low, the deposition rate drops, according to the results of the tests carried out, the nitrogen partial pressure is decisive, whereas the partial pressure of the sputter gas has comparatively little influence on the deposition rate.

During the sputter process the substrate holder SH with the substrate SB attached thereto is held at earth potential, whereas a sputter target TG of a 200 mm diameter with high-purity carbon—in the tests carbon with a purity of 99.999% was used—functions as a negatively biassed cathode. Magnetrons MG attached under the sputter cathode TG [sic] feed the gas discharge necessary for the sputtering with high frequency energy at a frequency of 13.56 MHz, the power supplied corresponds to a power density of 3.2 W/cm$^2$ on the sputter target TG. The sputter target bias is produced as a result of the gas discharge and depends substantially on the high frequency power supplied, the gas flow or pressure and the distance between the sputter target and substrate; typical values under the process conditions mentioned here are between approx. −200 V at 5 Pa gas pressure and −380 V at 2 Pa.

The sputter target TG of the chamber is water-cooled to dissipate the heat produced by the magnetrons MG and is maintained at ambient temperature in this manner. The temperature of the substrate SB is monitored by means of a thermoelement TE provided in the substrate holder SH. In order to be able to deposit carbon layers which have a low internal strain (below 10 MPa), the temperature of the deposited carbon layer must be kept below 50° C. during the deposition process. For this reason the sputter deposition was interrupted as soon as the temperature of the substrate SB measured by the thermoelement TE exceeded 40° C. and the sputter process continued after the substrate has sufficiently cooled. The duration of the interruption in the sputter process, depending on the substrate used, amounted in each case to approximately a few minutes. In this manner, it was also possible to deposit extremely thick layers of approx. 10 μm.

The substrate holder SH is height adjustable and as a consequence the distance between the substrate SB and the sputter cathode TG can be set. The best results with respect to the homogeneity of the carbon layer were achieved with a distance of 90 mm between the substrate and the sputter cathode. Although the deposition rate rises as the distance between the substrate and cathode reduces, at a distance of 50 mm the deposition rate was found to be approx. 30% higher. Thus, it is necessary to weigh up the required duration of the deposition and the desired homogeneity when selecting the distance.

After the sputtering process the substrate was thermally treated at a temperature in excess of 120° C. under a high vacuum. The term "high vacuum" is understand to refer to a vacuum where the pressure is at least 10% lower than the gas pressure of the sputter process. In the exemplified embodiment during the thermal treatment the gas supply GE was closed and the evacuation pump valve VL was open and thus the pressure was reduced to the final end pressure of approx. $10^{-3}$ Pa.

The thermal treatment is expediently performed in the same process device RK as the sputter process. Advantageously, both process steps are performed whilst maintaining the vacuum, namely in such a manner that after the deposition process the chamber RK is evacuated and the substrate is transported in the vacuum from the sputter position to the side of the thermal treatment, more specifically without the chamber being flushed or opened which could result in the substrate possibly coming into contact with contaminants. In addition, the substrate SB is moved for the thermal treatment towards the heating element HZ, in the exemplified embodiment to approx. 45 mm. In the case of the process chamber described above the heating element HZ consists of a so-called thermocoax which is wound in a spiral-like manner and whose heating output and temperature curve with respect to time can be controlled by means of a temperature sensor TS installed and an electronic temperature control (not illustrated in FIG. 1).

Within a period of time of 30 minutes the substrate is heated to a predetermined final temperature of at least 100° C. in this case to 180° C. Test results further provide evidence that the rate of temperature change also has a substantial influence on the quality of the carbon films, so that any great deviation even momentarily from the average heating rate is to be avoided. Carbon layers which have the favourable characteristics mentioned were also successfully produced when heating to a final temperature of 300° C.

Table 1 illustrates a typical example of the temperature curve of the substrate measured using the thermoelement TE of the substrate holder SH during the heating process, and also the temperature of the heating element HZ, the times from the starting point of the heating process being included.

Once the final temperature has been achieved, the heating element HE is switched off and the substrate cools down, after a period of at least 30 minutes it has cooled down to a temperature of approximately 70° C. This time depends upon the substrate used; rather than the approximately 30 minutes in the case of silicium discs, the cooling period, for example, where the membranes are 3 $\mu$m thick, as are used, for example, for lithographic aperture masks and which are likewise provided with carbon layers according to the process in accordance with the invention, lasts approximately two hours as a result of the reduced heat contact. The high vacuum is maintained during the entire thermal treatment; the chamber RK is only ventilated in order to be able to remove the substrate after the temperature of the substrate has cooled down to the mentioned 70° C. or below.

TABLE 1

| Time [min] | Temperature of the Substrate [° C.] | Temperature of the Heating Element [° C.] |
|---|---|---|
| 0 | 20 | 20 |
| 5 | 72 | 80 |
| 10 | 110 | 140 |
| 15 | 134 | 200 |
| 20 | 150 | 240 |
| 25 | 165 | 260 |
| 30 | 177 | 290 |

Carbon films up to 10 $\mu$m thick could be produced according to the process in accordance with the invention on various substrates, for example, silicium wafers, silicium membranes and glass plates, whose surfaces to be coated have been cleaned according to known methods prior to the coating process. The homogeneity of the carbon film was tested using comparative measurements of the transparency on a square glass plate 17×17 cm² which had been provided with a 0.5 $\mu$m carbon film; this is to be regarded in comparison with the size of the sputter target TG with a diameter of 200 mm. The transparency lies in a an area with 150 mm diameter around the centre within 1.6% around the value of the coefficient of transparency in the centre of the glass plate and in an area of 200 mm within 3%.

The best results for the carbon layers produced were achieved at a total pressure of gas mixture of 2 Pa and a ratio of gas partial pressures of 1:1, corresponding to a nitrogen proportion of approx. 50% with a variation width of approx. ±5%. These layers comprise an inner voltage around −3 MPa, producing a negative strain value for the tensile stress. Even over longer periods of storage, i.e. for months, the films do not absorb any moisture from the air. For example, it was established that the structure of the carbon layers (see regarding this the discussion relating to FIG. 4 below) when stored over a storage period of 14 days at air humidity below 70° C. at room temperature did not change. The behaviour over time of the internal strain was monitored on a 1 $\mu$m thick carbon layer which had been applied to a silicium substrate according to the process in accordance with the invention and even after a period of time of 4 months, it did not demonstrate any significant change with respect to the measuring accuracy (±2 MPa) in comparison with the strain value of the freshly produced film. This stability under storage, which films which have been sputtered but not thermally treated do not have, is explained by the fact that "active" lattice sites and open bonds, which are present after sputtering and are responsible for contaminants such as air moisture being absorbed, are annealed during the thermal treatment.

Figure 2:
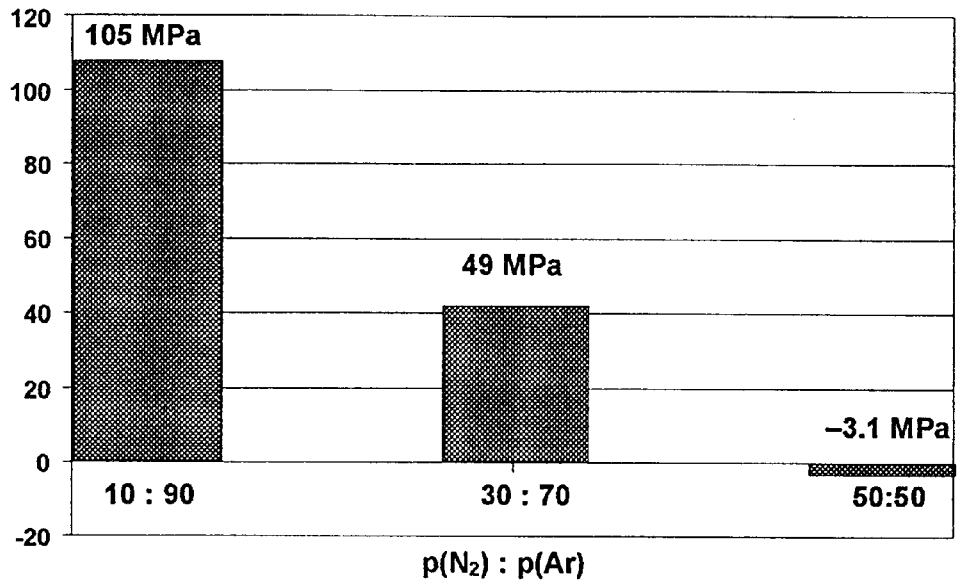
FIG. 2 shows the dependency of the internal strain on the gas composition with reference to a few typical examples.

It should be noted at this point, that the carbon films supposedly have a considerable proportion of nitrogen, even if comprehensive tests of the film composition are net yet available. Regardless of this and also for the sake of brevity, all films produced according to the invention are referred to here as carbon films. The test results further show that the greater the nitrogen proportion in the gas mixture, the more the compressive strain reduces, switching to the tensile stress range. Thus, when varying the ratio of nitrogen-argon in the gas mixture the internal strain changes from 105 MPa at 10% nitrogen and 90% argon, passing through a 49 MPa at 30% nitrogen, to 3.1 MPa at 50% nitrogen (FIG. 2), wherein positive strain values represent compressive strains and negative strain values represent tensile stresses. It is thus possible by correspondingly controlling the process parameters, more specifically the nitrogen proportion, to adjust the internal strain of the film to a predetermined strain value in the region between approximately 100 MPa and approximately −5 MPa. For extremely low strains (below 5 MPa, compressive to tensile as desired) a gas pressure ratio in the range of 5% around 1:1 is to be set. The internal strain of carbon layers was determined on 1.5 $\mu$m thick layers, which had been applied to silicium wafers with 100 mm diameter according to the process in accordance with the invention, by bending the substrate after producing the layer.

Carbon layers which fulfil the said requirements for the internal strain, namely internal compressive strains below 100 MPa as far as tensile stresses, and the stability under storage, can be produced using gas mixtures where the nitrogen proportion amounts to 20% to 70%, however, it can be assumed that even at higher nitrogen proportions satisfactory films can be obtained. In contrast, if the nitrogen proportion is lower, the internal strains rise considerably. As a consequence of the high compressive strains, such films can form waves and do not adhere well to the substrate.

Figure 3:
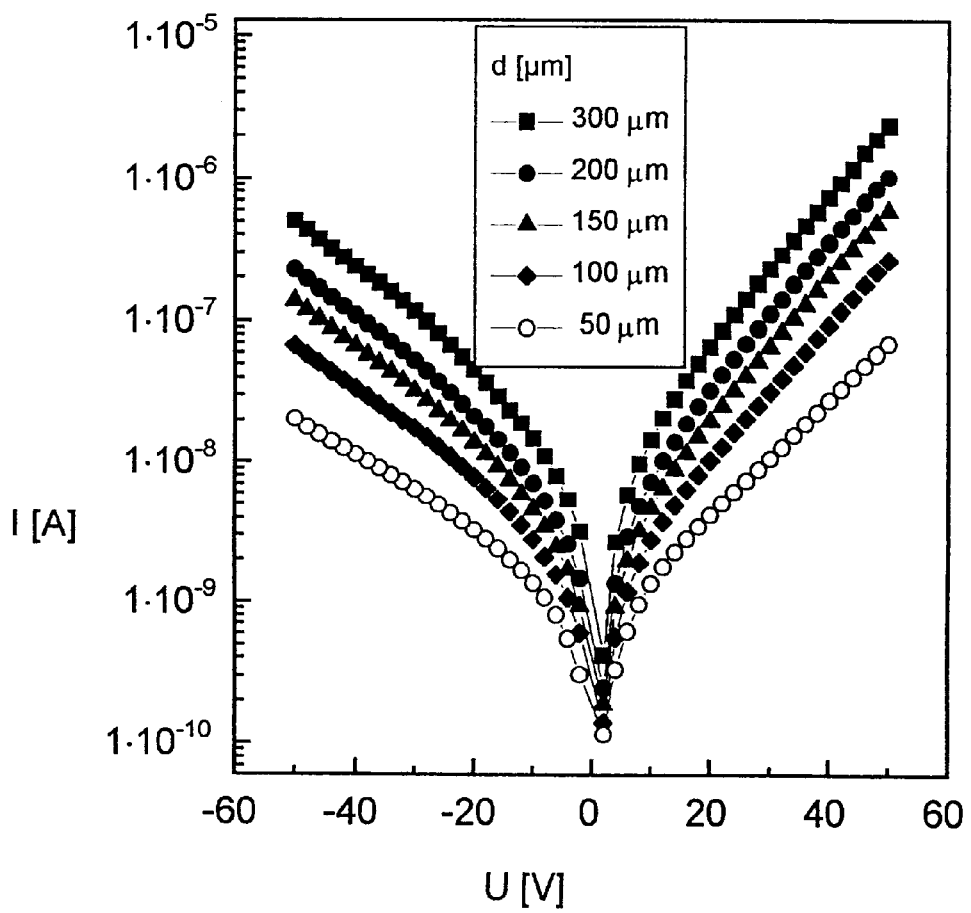
FIG. 3 shows current-voltage characteristic curves measured on carbon films in accordance with the invention.
Figure 4:
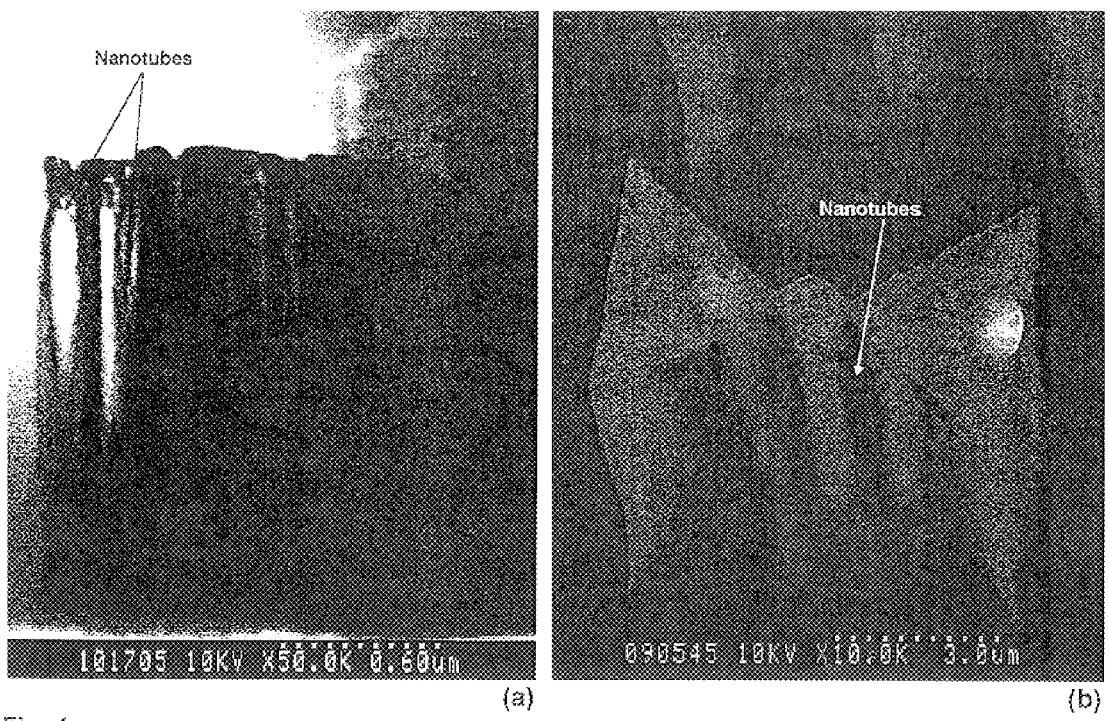
FIG. 4 shows raster electron microscope images of a cross-section through a carbon film (FIG. 4a) produced in accordance with the invention and a view of a structured film (FIG. 4b).

FIG. 4 illustrates images obtained using a raster electron microscope of carbon films according to the invention. The cross-section illustrated in FIG. 4a through a film demonstrates a fibre- and/or tube [structure] which extends substantially perpendicular to the film. The fibres or tubes typically have a diameter in the range of 1 to 30 mm. This fibre/tube structure which extends in the transverse direction with respect to the film is also visible in the edges of the carbon film structures illustrated in FIG. 4b (so-called Aharonov-Bohm rings). This structure is based on so-called carbon 'nanotubes' which are discussed, for example, in a special publication of the Applied Physics A, Vol. 67, No. 1(July 1998), more specifically on pages 1–22 and 39–46. They also offer an explanation for low density of the carbon layers according to the invention of approximately 60% of a graphite layer. Therefore, the smallest possible structures which can be achieved with the carbon layers are in the region of the diameter of these nanotubes. Further reference to the presence of nanotubes was found when measuring direct current - current-voltage on contacted carbon films. FIG. 3 shows current-voltage curves on carbon layers of 0.5 $\mu$m depth which were deposited on a GaAs substrate and structured in ranges of different diameter d from 50 to 300 $\mu$m; the current I is quoted in amperes, the voltage U is quoted in volts. The progression of these current-voltage curves is similar to those of one-dimensional conductors, such as, for example, illustrated by L. Kouwenhoven, Science, Vol. 275(1997), Page 1896, and indicates a specific resistance of the layers approximately 3 $10^6$ $\Omega$m.

Furthermore, FIG. 4b demonstrates the possibility of structuring the carbon layers which can be produced according to the invention and whose structures after being produced on a silicium substrate were etched using masking technology in an oxygen plasma. In tests, it was possible to etch out of the carbon layer, for example, 7 μm deep lines with widths of 120 nm, square rods 7 μm deep with a cross-section of 150×150 nm² or Aharonov-Bohm rings with external diameters of 600 nm with extremely steep structure edges.

The said characteristics of the carbon films in accordance with the invention provide numerous possible applications, particular examples of which are:

- Application as an ion-absorbing layer (so-called stopper layer) to protect the substrate material from being damaged by exposure to ions, for example, for aperture masks used in ion beam lithography;
- In the area of nano-electronics, the use of nanotubes as loss-free electron lines;
- New, non-linear electronic components exploiting the non-linear current-voltage characteristic of the carbon layers;
- The use of nanotubes for the field emission in the vacuum, for example, for vacuum components or so-called flat-panel displays;
- Use in sensor technology exploiting the non-linear inter-relationship between the resistance of the layers and the load.

What is claimed is:

1. A process for producing a carbon film on a substrate, comprising the steps of:
   - depositing carbon at a predetermined gas pressure on the substrate by sputtering from a carbon sputter target in a gas mixture containing nitrogen in a minimum proportion of 20% and a sputter gas, and
   - subsequently subjecting the substrate under a high vacuum to thermal treatment at a temperature of at least 100° C.

2. The process according to claim 1, wherein the temperature of the substrate is maintained at or below 50° C. during sputtering.

3. The process according to claim 1, wherein the gas mixture contains nitrogen of a proportion in the range of from 20% to 70%.

4. The process according to claim 3, wherein the gas mixture contains nitrogen of a proportion in the range of from 45% to 55%.

5. The process according to claim 1, wherein the sputter gas used in the gas mixture is an inert gas.

6. The process according to claim 5, wherein the inert gas in argon.

7. The process according to claim 1, wherein the gas pressure of the gas mixture is between 0.2 Pa and 5 Pa.

8. The process according to claim 1, wherein the sputtering is performed by means of high frequency sputtering.

9. The process according to claim 8, wherein the sputtering is performed at a frequency of approximately 13.56 MHz.

10. The process according to claim 1, wherein the sputtering and the thermal treatment are performed while maintaining the vacuum in the same process device.

11. The process according to claim 1, wherein the temperature of the substrate is maintained at a temperature not greater than 300° C. during thermal treatment.

12. The process according to claim 1, wherein during thermal treatment the substrate is heated within a period of at least 30 minutes to a predetermined final temperature of at least 100° C., and the substrate is then cooled within a time of at least 30 minutes to a temperature of approximately 70° C.

13. The process according to claim 12, wherein the predetermined final temperature is 100° C. to 180° C.

14. The process according to claim 1, wherein after the thermal treatment the substrate is held under high vacuum until it has cooled to a maximum temperature of 70° C.

* * * * *